(12) United States Patent
Shi et al.

(10) Patent No.: US 8,835,962 B2
(45) Date of Patent: Sep. 16, 2014

(54) CAVITY ELECTROLUMINESCENT DEVICES WITH INTEGRATED MICROLENSES

(75) Inventors: Yijian Shi, Menlo Park, CA (US); Qianfei Xu, Menlo Park, CA (US)

(73) Assignee: SRI International, Menlo Park, CA (US)

( * ) Notice: Subject to any disclaimer, the term of this patent is extended or adjusted under 35 U.S.C. 154(b) by 0 days.

(21) Appl. No.: 13/695,434

(22) PCT Filed: May 9, 2011

(86) PCT No.: PCT/US2011/035778
§ 371 (c)(1),
(2), (4) Date: Nov. 25, 2012

(87) PCT Pub. No.: WO2011/143127
PCT Pub. Date: Nov. 17, 2011

(65) Prior Publication Data
US 2013/0214254 A1    Aug. 22, 2013

Related U.S. Application Data

(60) Provisional application No. 61/334,500, filed on May 13, 2010.

(51) Int. Cl.
*H01L 33/58*    (2010.01)
*H01L 51/52*    (2006.01)
*H01L 51/56*    (2006.01)

(52) U.S. Cl.
CPC ............ *H01L 51/5275* (2013.01); *H01L 51/56* (2013.01)
USPC ........................................................... 257/98

(58) Field of Classification Search
CPC ......... H01L 33/20; H01L 33/22; H01L 33/24; H01L 33/44; H01L 33/58; H01L 33/10; H01L 33/105; H01L 33/46; H01L 33/465; H01L 33/60
USPC .............. 257/79, 184, 98, E33.005, E33.068, 257/E33.069, E33.07; 438/22, 29, 31, 32
See application file for complete search history.

(56) References Cited

U.S. PATENT DOCUMENTS

| | | | | |
|---|---|---|---|---|
| 7,132,789 B2 * | 11/2006 | Kobayashi | ..................... | 313/504 |
| 7,362,515 B2 * | 4/2008 | Miyazawa | ..................... | 359/722 |
| 8,294,360 B2 * | 10/2012 | Oyamada | ..................... | 313/504 |
| 2002/0101729 A1 * | 8/2002 | Hayashi et al. | ................. | 362/84 |
| 2004/0056590 A1 * | 3/2004 | Lim et al. | ..................... | 313/506 |
| 2004/0113550 A1 * | 6/2004 | Adachi et al. | ................. | 313/512 |
| 2004/0160165 A1 * | 8/2004 | Yamauchi | ..................... | 313/498 |
| 2004/0183433 A1 * | 9/2004 | Cho et al. | ..................... | 313/504 |
| 2004/0195205 A1 * | 10/2004 | Yudasaka | ..................... | 216/23 |
| 2005/0077820 A1 * | 4/2005 | Onishi et al. | ................. | 313/506 |

(Continued)

FOREIGN PATENT DOCUMENTS

KR    2006059067 A *    6/2006
WO    WO 2009093996 A1 *    7/2009

*Primary Examiner* — Michele Fan
(74) *Attorney, Agent, or Firm* — Richard Aron Osman

(57) ABSTRACT

Herein is provided electroluminescent devices, and methods for their use and production. In some embodiments, the devices contain embedded optical features that act as lenses to direct photons emitted from an electroluminescent material. The lensing effect from the optical features allows increased light extraction from the devices compared with devices lacking such features. In some embodiments the devices are prepared using a plurality of etching and deposition steps.

3 Claims, 7 Drawing Sheets

(56) References Cited

U.S. PATENT DOCUMENTS

| | | | |
|---|---|---|---|
| 2005/0212407 A1* | 9/2005 | Matsusue | 313/503 |
| 2005/0236620 A1* | 10/2005 | Yamada | 257/59 |
| 2005/0285509 A1* | 12/2005 | Funamoto et al. | 313/504 |
| 2008/0220554 A1* | 9/2008 | Shigemura et al. | 438/46 |
| 2008/0248240 A1* | 10/2008 | Shi | 428/141 |
| 2009/0115705 A1* | 5/2009 | Miller et al. | 345/76 |
| 2010/0062147 A1* | 3/2010 | Kinoshita | 427/58 |
| 2010/0188652 A1* | 7/2010 | Bianchi et al. | 356/73.1 |
| 2011/0012139 A1* | 1/2011 | Yamamoto | 257/88 |
| 2011/0042657 A1* | 2/2011 | Shi | 257/40 |
| 2011/0165517 A1* | 7/2011 | Nishiyama et al. | 430/270.1 |
| 2011/0254031 A1* | 10/2011 | Yan et al. | 257/98 |
| 2012/0018764 A1* | 1/2012 | Choi et al. | 257/99 |
| 2012/0299462 A1* | 11/2012 | Shi et al. | 313/498 |

\* cited by examiner

CAVITY ELECTROLUMINESCENT DEVICES WITH INTEGRATED MICROLENSES

CROSS REFERENCE TO RELATED APPLICATIONS

This application claims priority under 35 U.S.C. §119 to U.S. Provisional Application Ser. No. 61/334,500, filed May 13, 2010, the contents of which are incorporated herein by reference in their entirety.

BACKGROUND

Electroluminescent devices such as organic light emitting diodes (OLEDs) are becoming widely used in applications such as displays. A common configuration for such devices involves a plurality of overlapping component layers. At a minimum, standard OLEDs require two electrodes and an electroluminescent material contacting both electrodes. Holes and electrons are individually injected into the electroluminescent material from the electrodes, and recombine to release energy in the form of visible, UV, or infrared light. So-called "sandwich" device architectures involve a layer of electroluminescent material sandwiched between the two electrodes. In devices using such geometry, at least one of the electrodes must be transparent to allow photons emitted from the electroluminescent material to escape the device. Nevertheless, since light is emitted in all directions by the electroluminescent layer, such devices exhibit lower emission efficiency when emitted light is trapped in the device (e.g. by waveguiding).

SUMMARY

In some aspects, the disclosure provides an electroluminescent device comprising: an electroluminescent layer comprising an organic electroluminescent material; an electron injection layer comprising an electron injection material; a hole injection layer comprising a hole injection material; and a lens layer comprising a lens material. The lens layer contacts the electroluminescent layer. Furthermore, the lens layer is continuous and is patterned with an interconnected network of cavities, wherein the cavities extend not more than partially through the thickness of the lens layer. One of the electron injection layer or the hole injection layer is entirely disposed within the cavities. At least a portion of the electroluminescent material is disposed within the cavities. Furthermore, the lens material has a refractive index lower than the refractive index of the electroluminescent material.

In other aspects, the disclosure provides an electroluminescent device comprising: an electroluminescent layer comprising an organic electroluminescent material; a first electrode and a second electrode; and a lens layer comprising an optical material. The electroluminescent layer and the first electrode have complementary patterns such that they are in contact over a portion of the device area and are not in contact over the remaining portion of the device area, wherein a plurality of cavities are formed where the electroluminescent layer and first electrode are not in contact. Furthermore, the lens layer is disposed within the cavities and contacts both the electroluminescent layer and the first electrode.

In other aspects, the disclosure provides a method for forming an electroluminescent device comprising: (a) depositing a resist material in a pattern on an optical layer, wherein the optical layer comprises an optical material; (b) partially etching the optical layer in the areas not covered by the resist material to form a plurality of interconnected or non-interconnected cavities in the optical layer; (c) depositing an electrode material into the cavities; (d) removing the resist material and the electrode material coating the resist material.

In other aspects, the disclosure provides a method for forming an electroluminescent device comprising: (a) depositing a resist material in a pattern on an electrode layer, wherein the electrode layer comprises a conductive electrode material; (b) partially etching the electrode layer in the areas not covered by the resist material to form a plurality of interconnected or non-interconnected cavities in the electrode layer; (c) depositing an optical material into the cavities; (d) removing the resist material and any material coating the resist material.

These and other aspects of the invention will be apparent from the disclosure provided below, including the claims and drawings.

DEFINITIONS

Figure 1A:
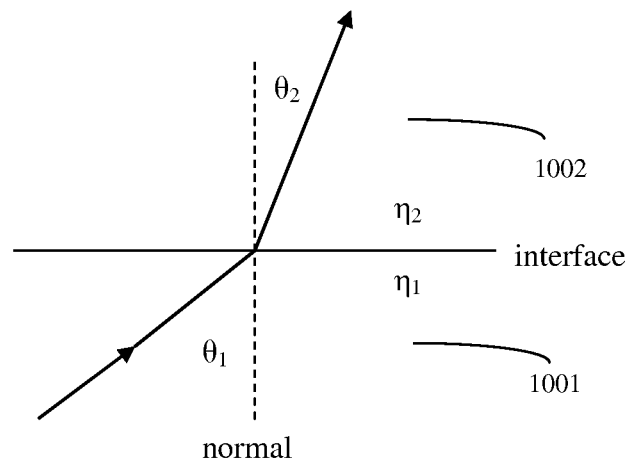
FIGS. 1a and 1b show schematic images of the behavior of light propagating through regions of differing refractive indices.

Unless otherwise indicated, the disclosure is not limited to specific procedures, materials, or the like, as such may vary. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Thus, for example, reference to "a layer" includes not only a single layer but also a combination of two or more layers, reference to "a substituent" includes a single substituent as well as two or more substituents, and the like.

In describing and claiming the present invention, certain terminology will be used in accordance with the definitions set out below. It will be appreciated that the definitions provided herein are not intended to be mutually exclusive. Accordingly, some chemical moieties may fall within the definition of more than one term.

As used herein, the phrases "for example," "for instance," "such as," or "including" are meant to introduce examples that further clarify more general subject matter. These examples are provided only as an aid for understanding the disclosure, and are not meant to be limiting in any fashion.

As used herein, the phrase "having the formula" or "having the structure" is not intended to be limiting and is used in the same way that the term "comprising" is commonly used. The term "independently selected from" is used herein to indicate that the recited elements, e.g., R groups or the like, can be identical or different.

As used herein, the terms "may," "optional," "optionally," or "may optionally" mean that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

The term "substrate" is used herein in its ordinary sense and means a body or base layer onto which other layers are deposited. For instance, the term "substrate" refers to any type of base layer considered suitable for the manufacture of an electroluminescent device or larger system comprising electroluminescent devices. Specifically, a substrate is used to provide the layered structure of the invention sufficient mechanical strength for handling. Hence, the term may also refer to the substrate with the materials deposited on it during or after any of the various stages of treatment through which it goes during the process of electroluminescent device manufacture, for example during or after the deposition of a hole-injection layer, or the like. The term is not meant to apply only to passive material layers. Therefore, in some cases one or more of the active electroluminescent device layers (e.g., an electrode layer composed of ITO) functions also as a substrate.

The term "transparent" here is to be construed as allowing an amount of light transmission which is appropriate in the circumstances. A transparent material need not be as transmissive as plate glass provided it is sufficiently transmissive for the application at hand. A transparent material may also allow only particular frequency ranges to pass through and block others, if the blocking is desired or is not a problem in the particular application. The term "light" should be understood to encompass infrared and ultraviolet radiation as well as visible light.

The term "alkyl" as used herein refers to a branched or unbranched saturated hydrocarbon group (i.e., a mono-radical) typically although not necessarily containing 1 to about 24 carbon atoms, such as methyl, ethyl, n-propyl, isopropyl, n-butyl, isobutyl, t-butyl, octyl, decyl, and the like, as well as cycloalkyl groups such as cyclopentyl, cyclohexyl and the like. Generally, although not necessarily, alkyl groups herein may contain 1 to about 18 carbon atoms, and such groups may contain 1 to about 12 carbon atoms. The term "lower alkyl" intends an alkyl group of 1 to 6 carbon atoms. "Substituted alkyl" refers to alkyl substituted with one or more substituent groups, and this includes instances wherein two hydrogen atoms from the same carbon atom in an alkyl substituent are replaced, such as in a carbonyl group (i.e., a substituted alkyl group may include a —C(=O)— moiety). The terms "heteroatom-containing alkyl" and "heteroalkyl" refer to an alkyl substituent in which at least one carbon atom is replaced with a heteroatom, as described in further detail infra. If not otherwise indicated, the terms "alkyl" and "lower alkyl" include linear, branched, cyclic, unsubstituted, substituted, and/or heteroatom-containing alkyl or lower alkyl, respectively.

The term "alkenyl" as used herein refers to a linear, branched or cyclic hydrocarbon group of 2 to about 24 carbon atoms containing at least one double bond, such as ethenyl, n-propenyl, isopropenyl, n-butenyl, isobutenyl, octenyl, decenyl, tetradecenyl, hexadecenyl, eicosenyl, tetracosenyl, and the like. Generally, although again not necessarily, alkenyl groups herein may contain 2 to about 18 carbon atoms, and for example may contain 2 to 12 carbon atoms. The term "lower alkenyl" intends an alkenyl group of 2 to 6 carbon atoms. The term "substituted alkenyl" refers to alkenyl substituted with one or more substituent groups, and the terms "heteroatom-containing alkenyl" and "heteroalkenyl" refer to alkenyl in which at least one carbon atom is replaced with a heteroatom. If not otherwise indicated, the terms "alkenyl" and "lower alkenyl" include linear, branched, cyclic, unsubstituted, substituted, and/or heteroatom-containing alkenyl and lower alkenyl, respectively.

The term "alkynyl" as used herein refers to a linear or branched hydrocarbon group of 2 to 24 carbon atoms containing at least one triple bond, such as ethynyl, n-propynyl, and the like. Generally, although again not necessarily, alkynyl groups herein may contain 2 to about 18 carbon atoms, and such groups may further contain 2 to 12 carbon atoms. The term "lower alkynyl" intends an alkynyl group of 2 to 6 carbon atoms. The term "substituted alkynyl" refers to alkynyl substituted with one or more substituent groups, and the terms "heteroatom-containing alkynyl" and "heteroalkynyl" refer to alkynyl in which at least one carbon atom is replaced with a heteroatom. If not otherwise indicated, the terms "alkynyl" and "lower alkynyl" include linear, branched, unsubstituted, substituted, and/or heteroatom-containing alkynyl and lower alkynyl, respectively.

The term "alkoxy" as used herein intends an alkyl group bound through a single, terminal ether linkage; that is, an "alkoxy" group may be represented as —O-alkyl where alkyl is as defined above. A "lower alkoxy" group intends an alkoxy group containing 1 to 6 carbon atoms, and includes, for example, methoxy, ethoxy, n-propoxy, isopropoxy, t-butyloxy, etc. Substituents identified as "$C_1$-$C_6$ alkoxy" or "lower alkoxy" herein may, for example, may contain 1 to 3 carbon atoms, and as a further example, such substituents may contain 1 or 2 carbon atoms (i.e., methoxy and ethoxy).

The term "aryl" as used herein, and unless otherwise specified, refers to an aromatic substituent generally, although not necessarily, containing 5 to 30 carbon atoms and containing a single aromatic ring or multiple aromatic rings that are fused together, directly linked, or indirectly linked (such that the different aromatic rings are bound to a common group such as a methylene or ethylene moiety). Aryl groups may, for example, contain 5 to 20 carbon atoms, and as a further example, aryl groups may contain 5 to 12 carbon atoms. For example, aryl groups may contain one aromatic ring or two or more fused or linked aromatic rings (i.e., biaryl, aryl-substituted aryl, etc.). Examples include phenyl, naphthyl, biphenyl, diphenylether, diphenylamine, benzophenone, and the like. "Substituted aryl" refers to an aryl moiety substituted with one or more substituent groups, and the terms "heteroatom-containing aryl" and "heteroaryl" refer to aryl substituent, in which at least one carbon atom is replaced with a heteroatom, as will be described in further detail infra. If not otherwise indicated, the term "aryl" includes unsubstituted, substituted, and/or heteroatom-containing aromatic substituents.

The term "aralkyl" refers to an alkyl group with an aryl substituent, and the term "alkaryl" refers to an aryl group with an alkyl substituent, wherein "alkyl" and "aryl" are as defined above. In general, aralkyl and alkaryl groups herein contain 6 to 30 carbon atoms. Aralkyl and alkaryl groups may, for example, contain 6 to 20 carbon atoms, and as a further example, such groups may contain 6 to 12 carbon atoms.

The term "alkylene" as used herein refers to a di-radical alkyl group. Unless otherwise indicated, such groups include saturated hydrocarbon chains containing from 1 to 24 carbon atoms, which may be substituted or unsubstituted, may contain one or more alicyclic groups, and may be heteroatom-containing. "Lower alkylene" refers to alkylene linkages containing from 1 to 6 carbon atoms. Examples include, methylene (—$CH_2$—), ethylene (—$CH_2CH_2$—), propylene (—$CH_2CH_2CH_2$—), 2-methylpropylene (—$CH_2$—CH($CH_3$)—$CH_2$—), hexylene (—$(CH_2)_6$—) and the like.

Similarly, the terms "alkenylene," "alkynylene," "arylene," "aralkylene," and "alkarylene" as used herein refer to diradical alkenyl, alkynyl, aryl, aralkyl, and alkaryl groups, respectively.

The term "amino" is used herein to refer to the group —$NZ^1Z^2$ wherein $Z^1$ and $Z^2$ are hydrogen or nonhydrogen substituents, with nonhydrogen substituents including, for example, alkyl, aryl, alkenyl, aralkyl, and substituted and/or heteroatom-containing variants thereof.

The terms "halo" and "halogen" are used in the conventional sense to refer to a chloro, bromo, fluoro or iodo substituent.

The term "heteroatom-containing" as in a "heteroatom-containing alkyl group" (also termed a "heteroalkyl" group) or a "heteroatom-containing aryl group" (also termed a "heteroaryl" group) refers to a molecule, linkage or substituent in which one or more carbon atoms are replaced with an atom other than carbon, e.g., nitrogen, oxygen, sulfur, phosphorus or silicon, typically nitrogen, oxygen or sulfur. Similarly, the term "heteroalkyl" refers to an alkyl substituent that is heteroatom-containing, the term "heterocyclic" refers to a cyclic substituent that is heteroatom-containing, the terms "heteroaryl" and "heteroaromatic" respectively refer to "aryl" and "aromatic" substituents that are heteroatom-containing, and the like. Examples of heteroalkyl groups include alkoxyaryl, alkylsulfanyl-substituted alkyl, N-alkylated amino alkyl, and the like. Examples of heteroaryl substituents include pyrrolyl, pyrrolidinyl, pyridinyl, quinolinyl, indolyl, furyl, pyrimidinyl, imidazolyl, 1,2,4-triazolyl, tetrazolyl, etc., and examples of heteroatom-containing alicyclic groups are pyrrolidino, morpholino, piperazino, piperidino, tetrahydrofuranyl, etc.

"Hydrocarbyl" refers to univalent hydrocarbyl radicals containing 1 to about 30 carbon atoms, including 1 to about 24 carbon atoms, further including 1 to about 18 carbon atoms, and further including about 1 to 12 carbon atoms, including linear, branched, cyclic, saturated and unsaturated species, such as alkyl groups, alkenyl groups, aryl groups, and the like. "Substituted hydrocarbyl" refers to hydrocarbyl substituted with one or more substituent groups, and the term "heteroatom-containing hydrocarbyl" refers to hydrocarbyl in which at least one carbon atom is replaced with a heteroatom. Unless otherwise indicated, the term "hydrocarbyl" is to be interpreted as including substituted and/or heteroatom-containing hydrocarbyl moieties.

By "substituted" as in "substituted hydrocarbyl," "substituted alkyl," "substituted aryl," and the like, as alluded to in some of the aforementioned definitions, is meant that in the hydrocarbyl, alkyl, aryl, or other moiety, at least one hydrogen atom bound to a carbon (or other) atom is replaced with one or more non-hydrogen substituents. Examples of such substituents include, without limitation, functional groups, and the hydrocarbyl moieties $C_1$-$C_{24}$ alkyl (including $C_1$-$C_{18}$ alkyl, further including $C_1$-$C_{12}$ alkyl, and further including $C_1$-$C_6$ alkyl), $C_2$-$C_{24}$ alkenyl (including $C_2$-$C_{18}$ alkenyl, further including $C_2$-$C_{12}$ alkenyl, and further including $C_2$-$C_6$ alkenyl), $C_2$-$C_{24}$ alkynyl (including $C_2$-$C_{18}$ alkynyl, further including $C_2$-$C_{12}$ alkynyl, and further including $C_2$-$C_6$ alkynyl), $C_5$-$C_{30}$ aryl (including $C_5$-$C_{20}$ aryl, and further including $C_5$-$C_{12}$ aryl), and $C_6$-$C_{30}$ aralkyl (including $C_6$-$C_{20}$ aralkyl, and further including $C_6$-$C_{12}$ aralkyl). The above-mentioned hydrocarbyl moieties may be further substituted with one or more functional groups or additional hydrocarbyl moieties such as those specifically enumerated.

By the term "functional groups" is meant chemical groups such as halo, hydroxyl, sulfhydryl, $C_1$-$C_{24}$ alkoxy, $C_2$-$C_{24}$ alkenyloxy, $C_2$-$C_{24}$ alkynyloxy, $C_5$-$C_{20}$ aryloxy, acyl (including $C_2$-$C_{24}$ alkylcarbonyl (—CO-alkyl) and $C_6$-$C_{20}$ arylcarbonyl (—CO-aryl)), acyloxy(—O-acyl), $C_2$-$C_{24}$ alkoxycarbonyl (—(CO)—O-alkyl), $C_6$-$C_{20}$ aryloxycarbonyl (—(CO)—O-aryl), halocarbonyl(—CO)—X where X is halo), $C_2$-$C_{24}$ alkylcarbonato (—O—(CO)—O-alkyl), $C_6$-$C_{20}$ arylcarbonato (—O—(CO)—O-aryl), carboxy(—COOH), carboxylato (—COO$^-$), carbamoyl (—(CO)—$NH_2$), mono-substituted $C_1$-$C_{24}$ alkylcarbamoyl (—(CO)—NH($C_1$-$C_{24}$ alkyl)), di-substituted alkylcarbamoyl (—(CO)—N($C_1$-$C_{24}$ alkyl)$_2$), mono-substituted arylcarbamoyl (—(CO)—NH-aryl), thiocarbamoyl (—(CS)—$NH_2$), carbamido (—NH—(CO)—$NH_2$), cyano (—C≡N), isocyano (—N$^+$≡C$^-$), cyanato (—O—C≡N), isocyanato (—O—N$^+$≡C$^-$), isothiocyanato (—S—C≡N), azido (—N=N$^+$=N$^-$), formyl (—(CO)—H), thioformyl (—(CS)—H), amino (—$NH_2$), mono- and di-($C_1$-$C_{24}$ alkyl)-substituted amino, mono- and di-($C_5$-$C_{20}$ aryl)-substituted amino, $C_2$-$C_{24}$ alkylamido (—NH—(CO)-alkyl), $C_5$-$C_{20}$ arylamido (—NH—(CO)-aryl), imino (—CR=NH where R=hydrogen, $C_1$-$C_{24}$ alkyl, $C_5$-$C_{20}$ aryl, $C_6$-$C_{20}$ alkaryl, $C_6$-$C_{20}$ aralkyl, etc.), alkylimino (—CR=N(alkyl), where R=hydrogen, alkyl, aryl, alkaryl, etc.), arylimino (—CR=N(aryl), where R=hydrogen, alkyl, aryl, alkaryl, etc.), nitro (—$NO_2$), nitroso (—NO), sulfo (—$SO_2$—OH), sulfonato (—$SO_2$—O$^-$), $C_1$-$C_{24}$ alkylsulfanyl (—S-alkyl; also termed "alkylthio"), arylsulfanyl (—S-aryl; also termed "arylthio"), $C_1$-$C_{24}$ alkylsulfinyl (—(SO)-alkyl), $C_5$-$C_{20}$ arylsulfinyl (—(SO)-aryl), $C_1$-$C_{24}$ alkylsulfonyl (—$SO_2$-alkyl), $C_5$-$C_{20}$ arylsulfonyl (—$SO_2$-aryl), phosphono (—P(O)(OH)$_2$), phosphonato (—P(O)(O$^-$)$_2$), phosphinato (—P(O)(O$^-$)), phospho (—$PO_2$), and phosphino (—$PH_2$), mono- and di-($C_1$-$C_{24}$ alkyl)-substituted phosphino, mono- and di-($C_5$-$C_{20}$ aryl)-substituted phosphine. In addition, the aforementioned functional groups may, if a particular group permits, be further substituted with one or more additional functional groups or with one or more hydrocarbyl moieties such as those specifically enumerated above.

By "linking" or "linker" as in "linking group," "linker moiety," etc., is meant a bivalent radical moiety. Examples of such linking groups include alkylene, alkenylene, alkynylene, arylene, alkarylene, aralkylene, and linking moieties containing functional groups including, without limitation: amido (—NH—CO—), ureylene (—NH—CO—NH—), imide (—CO—NH—CO—), epoxy(—O—), epithio(—S—), epidioxy(—O—O—), carbonyldioxy(—O—CO—O—), alkyldioxy(—O—($CH_2$)$_n$—O—), epoxyimino (—O—NH—), epimino (—NH—), carbonyl (—CO—), etc.

When the term "substituted" appears prior to a list of possible substituted groups, it is intended that the term apply to every member of that group. For example, the phrase "substituted alkyl and aryl" is to be interpreted as "substituted alkyl and substituted aryl."

Unless otherwise specified, reference to an atom is meant to include isotopes of that atom. For example, reference to H is meant to include $^1$H, $^2$H (i.e., D) and $^3$H (i.e., T), and reference to C is meant to include $^{12}$C and all isotopes of carbon (such as $^{13}$C).

As used herein, the term "transparent" refers to a material that is permeable to electromagnetic radiation. In the specific context of a transparent coating employed in an LED, the term refers to a material that is permeable to the wavelengths of electromagnetic radiation that are emitted by the LED. Unless stated otherwise, the term includes materials that are completely permeable as well as materials that are semi-permeable.

As used herein, the term "patterned" (as in a device layer is "patterned") refers to a device layer that is not continuously present over the entire device area. A patterned device layer has areas in which the material of the layer is present and areas in which the material of the layer is not present (i.e. void spaces). A device layer is "uniform" if the device layer is not patterned—i.e., the device layer is continuously present over substantially the entire device area. Unless otherwise specified, however, a uniform device layer may or may not be of uniform thickness across the entire device area.

As used herein, when referring to the position of device layers, the terms "lower," "upper," "below," and "above" are used based on the convention that the substrate is the reference plane and is in the bottom-most position. Thus, an electrode that is "below" another layer is positionally closer to the substrate. Since some embodiments involve layers that are patterned, it will be appreciated that one layer may be only partially "below" another layer. That is, in the void spaces of a patterned layer, the layer immediately adjacent to (i.e. above) the patterned layer may extend down to (or below) the level of the patterned layer with respect to the substrate. In such embodiments the patterned layer is still referred to herein as the "lower" layer. The terms "directly below" and "directly above" are used herein to describe a first layer that is contacting a second layer and is closer to the substrate or farther from the substrate, respectively. For example, an optical layer that is "directly above" an electrode means that the optical layer and the electrode are in contact (either over the entire device area or over a portion of the device area), and the electrode is closer to the substrate (or the electrode is the substrate).

The term "light" (and, similarly, "photons") as used herein refers to visible, UV, and infrared light unless otherwise specified.

DETAILED DESCRIPTION

Before the present invention is further described, it is to be understood that this invention is not limited to particular embodiments described, as such may of course vary. Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention.

Aspects of the subject invention include electroluminescent devices and methods for making the same. In certain embodiments, the devices include a substrate, a hole-injection electrode layer, a dielectric layer, an electroluminescent layer, an electron-injection electrode layer, a plurality of microlenses, and an optional cavity. In certain embodiments, the hole-injection electrode layer is positioned above the substrate, the dielectric layer is positioned above the hole-injection layer, and the electron-injection electrode layer is positioned above the dielectric layer. In certain embodiments, this order is reversed.

In certain embodiments, the cavity extends through at least the dielectric layer and/or may extend through one or more of the electrode layers (e.g., the hole-injection and/or electron-injection electrode layer). In certain embodiments, the electroluminescent layer is positioned in the cavity and is in contact with the hole-injection electrode layer, the dielectric layer, and the electron-injection electrode layer. In certain embodiments, the electroluminescent layer is interposed between the hole-injection electrode layer and the electron-injection electrode layer.

In certain embodiments, the electroluminescent layer includes a polymeric material, and in certain embodiments, the electroluminescent layer includes one or more small molecules. In certain embodiments, an electrode layer (e.g., the electron-injection or hole-injection electrode layer) is positioned above the cavity and is configured for directing light through the substrate. In certain embodiments, an electrode layer (e.g., the electron-injection or hole-injection electrode layer) is positioned above and spans across the cavity. The use of the produced device(s) in electroluminescent displays is also provided herein.

In certain embodiments, the electroluminescent device includes an electrode layer positioned above the substrate. In certain embodiments, the electrode layer is positioned directly or indirectly above the substrate. For instance, the electrode layer may be positioned directly above the substrate, such that the electrode layer comes into direct contact with the substrate, or an intermediary layer (e.g., a barrier layer) may be interposed between the substrate and the electrode layer. Specifically, where the substrate is plastic, one or more barrier layers may be positioned between the substrate and the electrode layer. Such an intermediary layer may or may not continue along the entire length of the substrate and/or electrode layer.

In certain embodiments, the electrode layer positioned above the substrate is an anode layer. In certain embodiments, the anode layer includes a hole-injection electrode layer. The hole-injection electrode layer may be the anode layer or may be a separate layer that may or may not be directly associated (e.g., in contact with) the anode layer. Accordingly, in certain embodiments, the anode layer is in direct contact with the substrate and in direct contact with a hole injection layer. In certain embodiments, the anode layer is in contact with the substrate, a dielectric layer is positioned above the anode layer, and a hole injection layer is positioned above the dielectric layer. In certain embodiments, a hole transport layer is also included, for instance, a hole transport layer may be a layer that is positioned to be in contact with a hole-injection layer, which hole-injection layer may be positioned to be in contact with an anode layer or a dielectric layer.

In certain embodiments, the electrode layer that is positioned above the substrate is a cathode layer. In certain embodiments, the cathode layer includes an electron-injection layer. The electron-injection layer may be the cathode layer or may be a separate layer that may or may not be associated (e.g., in contact with) the cathode layer. Accordingly, in certain embodiments, the cathode layer is in direct contact with the substrate and in direct contact with an electron injection layer. In certain embodiments, the cathode layer is in contact with the substrate, a dielectric layer is positioned above the cathode layer, and an electron injection layer is positioned above the dielectric layer. In certain embodiments, an electron transport layer is also included, for instance, an electron transport layer may be a layer that is positioned to be in contact with an electron-injection layer, which electron-injection layer may be positioned to be in contact with a cathode layer or a dielectric layer.

Accordingly, whenever a hole-injection electrode layer is referenced, the referent may include a hole-injection layer and an anode layer (which may or may not be the same element), and further whenever an electron-injection electrode layer is referenced, the referent may include both an electron-injection layer and a cathode layer (which may or may not be the same element).

In certain embodiments, a hole-injection electrode layer (e.g., which may include or be the same as an anode layer) is positioned above the substrate. Accordingly, in certain embodiments, the hole-injection electrode layer may be the electrode layer itself, and in other embodiments, the hole-injection layer may be an electrode layer (electrical conduction layer) plus a layer of organic (either small molecule or conductive polymer).

Throughout this disclosure, only one configuration of the hole injection and electron injection electrodes may be described (i.e., the hole injection electrode as bottom electrode and electron injection electrode as top electrode, or vice versa). It will be appreciated that this is done merely for ease of description, and is not meant to imply that the alternative orientation is not within the scope of configurations of interest.

In certain embodiments, the electroluminescent device includes a dielectric layer positioned above the hole-injection electrode layer. In certain embodiments, the dielectric layer is positioned directly or indirectly above the hole-injection electrode layer.

In certain embodiments, the dielectric layer is configured for increasing electroluminescent efficiency and decreasing power consumption. Accordingly, in certain embodiments, the dielectric layer is thin. For instance, in certain embodiments, the term "thin" means that the dielectric layer is capable of reducing the distance between the electrodes and therefore reducing the voltage needed to generate electroluminescence. Specifically, in certain embodiments, the dielectric layer does not exceed about 1 micrometer in thickness. For instance, in certain embodiments, the dielectric layer may have a thickness of about 100 to about 5000 angstroms, for instance, about 500 to about 2000 angstroms. In certain embodiments, the dielectric layer exceeds 100 nms, exceeds 120, exceeds 150, or exceeds 200 nm in thickness.

However, it is to be noted that in certain situations dielectric materials may break down if excessive voltage is applied. Hence, a suitable dielectric material for use in an electroluminescent device of the subject invention has sufficient dielectric strength for its thickness to withstand the operating voltage required for an electroluminescent material to emit photons when an operating voltage is applied between a hole-injection and an electron-injection electrode layers that are separated from one another by the dielectric layer and in contact with an electroluminescent material. Accordingly, the dielectric material layer may have a sufficient dielectric strength for its thickness to withstand at least about 2 volts over the operating voltage. For example, if the device is constructed to emit light when a 5-volt potential is applied, the dielectric layer should be able to withstand at least about 7 volts.

In certain embodiments, the electroluminescent device includes an electron-injection electrode layer that is positioned above the substrate. In certain embodiments, the electron-injection electrode layer is positioned above the substrate and above the hole-injection electrode layer, and may also be positioned above a dielectric layer (if included), which layer, as described below, may at least partially bound a cavity.

In certain embodiments, the electron-injection electrode layer is positioned directly or indirectly above a dielectric layer. In certain embodiments, the electron-injection electrode layer is positioned above the substrate and the hole-injection electrode layer is positioned directly or indirectly above the dielectric layer.

In certain embodiments, the electroluminescent device includes a cavity, which cavity at least extends through a dielectric layer (if present) and may additionally extend through an electrode layer, for instance, a hole or electron-injection layer. For instance, in certain embodiments, the cavity extends through both the dielectric layer and the bottom most electrode layer (e.g., with respect to the substrate). In certain embodiments, the cavity extends through the dielectric layer but does not extend through the electrode layer(s). In such embodiments, the bottom most electrode layer (e.g., the hole-injection or electron-injection layer) comprises a material that is at least semi-transparent to electro-chemical radiation (e.g., light).

In certain embodiments, the cavity is at least partially bounded by one or more of a substrate, a hole-injection electrode layer, a dielectric layer, and an electron-injection electrode layer. For instance, in certain embodiments, the cavity is bounded by the hole-injection and the electron-injection electrode layers and may further be at least partially bounded by a portion of the dielectric material layer (if included) and/or the substrate or a material coating the substrate. Specifically, in certain embodiments, the cavity is bounded by a portion of the substrate, the hole-injection electrode layer, the dielectric layer, and the electron-injection electrode layer. In certain embodiments, the cavity is bounded by a portion of the hole-injection electrode layer, the dielectric layer, and the electron-injection electrode layer. In certain embodiments, the cavity is bounded by a portion of the substrate, the hole-injection electrode layer, and the electron-injection electrode layer.

In certain embodiments, the cavity includes an electroluminescent layer that is positioned within the lumen of the cavity. In certain embodiments, the cavity may be filled with a material, such as an electroluminescent material. In certain embodiments, the fill material, e.g., electroluminescent material, entirely fills the dimensions of the cavity, but does not over-flow beyond the dimensions of the cavity, nor is the material present between the cavity and the electron-injection electrode layer, in such a manner that it would be considered an intervening layer between the cavity and the electron-injection electrode layer. In certain embodiments, the fill material, e.g., electroluminescent material, entirely fills the dimensions of the cavity and over-flows beyond the dimensions of the cavity so as to form a material layer that is present between the cavity and the electron-injection electrode layer, in such a manner that it would be considered an intervening layer between the cavity and the electron-injection electrode layer.

In certain embodiments, the cavity does not extend through the electron-injection electrode layer. Rather, in certain embodiments, the electron-injection electrode layer may at least partially bound the cavity on one or more sides. For instance, in certain embodiments, the electron-injection electrode layer is positioned above the cavity and its length spans across the cavity (e.g., laterally). In certain embodiments, the electron-injection electrode layer bounds the cavity, however, the electroluminescent material which fills the cavity over-flows beyond the dimensions of the cavity and forms a material layer that is present between the cavity and the electron-injection electrode layer. In certain embodiments, the electron-injection electrode layer bounds the cavity and the electroluminescent material which fills the cavity does not over-flow beyond the dimensions of the cavity nor does it form a material layer between the cavity and the electron-injection electrode layer.

Accordingly, as can be seen with reference to the above, the cavity is bounded by various portions of the components of the electroluminescent device. Hence, the various surfaces of the portions of the components of the electroluminescent device which bound the cavity are herein referenced as being "internal surfaces of the cavity." Accordingly, the electroluminescent layer positioned within the cavity may contact one or more of a substrate, a material coating the substrate, a hole-injection electrode layer, a dielectric layer, and an electron-injection electrode layer. For instance, in certain embodiments, an electroluminescent layer positioned within the cavity contacts a surface of the substrate, a hole-injection electrode layer, a dielectric layer, and a electron-injection electrode layer. In certain embodiments, an electroluminescent layer positioned within the cavity contacts a hole-injection electrode layer, a dielectric layer, and an electron-injection electrode layer. For instance, in certain embodiments, the electroluminescent layer positioned within the cavity, does not contact the substrate. In certain embodiments, an electroluminescent layer positioned within the cavity contacts a hole-injection electrode layer and an electron-injection electrode layer. For instance, in certain embodiments, the electroluminescent layer positioned within the cavity, does not contact a dielectric layer.

A cavity of the subject invention may have any suitable configuration so long as it allows for both holes and electrons to be injected into an electroluminescent layer contained within the cavity. For example, in certain embodiments, the cavity is axially symmetrical. In certain embodiments, the cavity includes a constant cross-sectional area along the cavity axis. In certain embodiments, the cavity has a smaller cross-sectional area at the dielectric layer than the hole-injection electrode layer.

In some embodiments of the invention, a plurality of lens elements is present in the electroluminescent devices. By the term "lens element" as used herein is meant a region of the device comprising a material having a lower index of refraction than the index (or indices) of refraction of the surrounding material(s) and that redirects light emitted from the electroluminescent layer. Such redirection preferably occurs through refraction of the light, although in some embodiments redirection may occur via reflection of the light. Throughout this disclosure, the terms "lens element" and "lens layer" may be used interchangeably, but typically the lens layer comprises a plurality of lens elements (which may themselves be interconnected or non-interconnected).

In some embodiments, the lens layer and the dielectric layers are the same (i.e., it can be said that the dielectric layer functions as a lens layer, and vice versa). In other embodiments, a separate dielectric layer is present in addition to the lens elements.

In some embodiments, the lens elements are embedded entirely within one of the component layers of the device (e.g., within the electroluminescent layer), in which case the lens element will be surrounded on all sides by a single type of material. Alternatively, the lens elements traverse two or more component layers (e.g., traversing the hole injection electrode layer and the electroluminescent layer), in which case the lens element will be surrounded by two or more types of material. Alternatively, the lens elements are embedded within one of the component layers and border an adjacent layer (e.g., within the electroluminescent layer but bordering the hole injection layer), in which case the lens element will be surrounded by two types of material. As used herein, the term "component layer" refers to any of the following layers: substrate layer; hole-injection electrode layer; dielectric layer; and electron injection layer. It will be appreciated that some of the component layers, particularly the dielectric layer, may be discontinuous, meaning that not every region of the layer is physically and/or electrically connected with every other region of the layer (i.e., the layer may exist as islands of material).

The lens elements of the invention may be made from a material that is different from any of the other materials used in the device, or may be made from a material that is the same as one of the component layers in the device. In some cases, the lens elements are part of one of the component layer in the device, meaning that the component layer is positioned or shaped such that it is capable of acting as lens elements. For example, the dielectric layer described above may comprise a material having a relatively low index of refraction (e.g., $SiO_2$), and may be positioned so as to function as the lens elements of the invention. In other embodiments, the lens elements are distinct elements created within or between component layers. Examples of these embodiments are described in further detail below.

In some embodiments, the electroluminescent layer and the bottom electrode layer are patterned such that, in some regions of the device area the two layers make contact and in other regions of the device area the two layers do not make contact. In the regions where the two layers do not make contact, void spaces (i.e., cavities) are created between the layers. In some such embodiments, optical material is disposed within the cavities. Thus, optical material spans across the two layers and penetrates into both layers, but does not penetrate through either layer. In some embodiments, the cavities extend between 5% and 95% into either or both the electroluminescent layer and/or the bottom electrode layer. In some embodiments, such extension is between 25% and 75%, or is greater than 25%, or is less than 75%. The cavities may be interconnected or non-interconnected. It will be appreciated that, when the cavities are interconnected, there is in fact one continuous cavity. Nevertheless, herein such continuous cavity may be referred to as a plurality of cavities (since, in some cross sectional views of the device, it may appear that the cavity is non-interconnected).

As described elsewhere herein, in some embodiments the optical layer is a continuous layer that has etched within a network of interconnected channels. In some such embodiments, within such channels is disposed the bottom electrode. The bottom electrode is completely contained within the channels, and in some embodiments there is room above the bottom electrode (and still within the channels) for material from the electroluminescent layer. In some embodiments, the channels (which may also be referred to as cavities) comprise the bottom electrode and all of the electroluminescent material present in the device. That is, the electroluminescent layer, along with the bottom electrode, is completely contained within the channels. In other embodiments, the electroluminescent layer overfills the channels and creates a separate layer above the entirety of the optical layer. In some embodiments the channels extend between 5% and 95%, or between 10% and 90%, or between 25% and 75% of the way through the optical layer. In some embodiments, the channels extend at least 5%, or at least 10%, or at least 25%, or at least 50%, or at least 75% of the way through the optical layer.

In some embodiments, the devices of the invention further comprise an encapsulation layer. The encapsulation layer provides a barrier between the device and the environment, thereby protecting any sensitive device layers or materials from environmental factors. Potentially harmful environmental factors include water, air, UV light, etc. In some embodiments, the encapsulation layer is UV opaque, and/or impermeable to air and/or water.

The devices of the invention comprise a plurality of component layers; generally, the encapsulation layer is deposited over the "outermost" layer. In some embodiments, two encapsulation layers are used to protect both "outermost" layers. For example, in a device having a substrate, a hole-injection electrode disposed on the substrate, a dielectric/lens layer disposed on the hole-injection electrode, an electroluminescent layer dispose on the dielectric/lens layer, and an electro-injection layer disposed on the electroluminescent layer, Without wishing to be bound by theory, the following paragraphs refer to FIGS. 1 and 2 and discuss a mechanism that is proposed for the operation of the lens elements as described herein.

As is known in the art, Snell's Law determines the relationship between angle of incidence and angle of refraction when light encounters an interface between two materials having different indices of refraction. Snell's Law takes the form $\eta_1 \sin \theta_1 = \eta_2 \sin \theta_2$, where $\theta_1$ and $\eta_2$ are the indices of refraction for the two materials, and $\theta_1$ and $\theta_2$ are the angles of incidence and refraction, respectively. FIG. 1a shows a simple application of Snell's Law, in which a ray of light passes from first material 1 having index of refraction $\eta_1$ to second material 2 having index of refraction $\eta_2$. In the figure, $\eta_1 \geq \eta_2$, so it follows that $\theta_1 \leq \theta_2$.

Figure 1B:
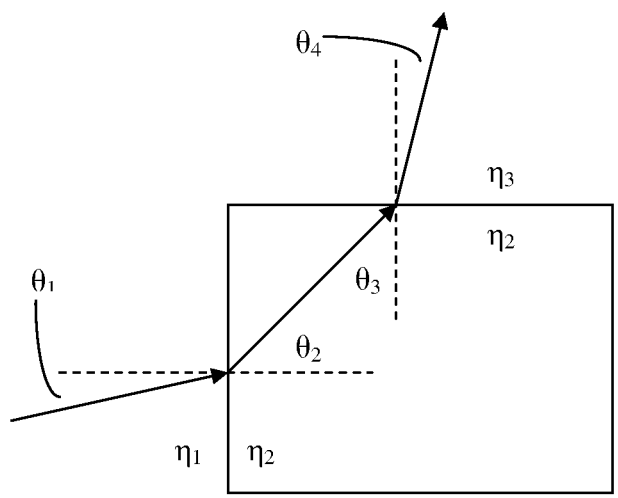

In the devices of the invention, a material having a relatively low index of refraction is embedded within one or more component layers having relatively higher indices of refraction. FIG. 1b demonstrates the application of Snell's Law for light encountering a rectangular body of material having a relatively low index of refraction and, on two sides, bordering material(s) having a relatively high index of refraction. In the figure, $\eta_1 > \eta_2$, and $\eta > \eta_2$, although $\eta_3$ and $\eta_1$ are not necessarily equal. Due to the differences in indices of refraction, it follows that $\theta_1 < \theta_2$, and that $\theta_4 < \theta_3$.

Figure 2:
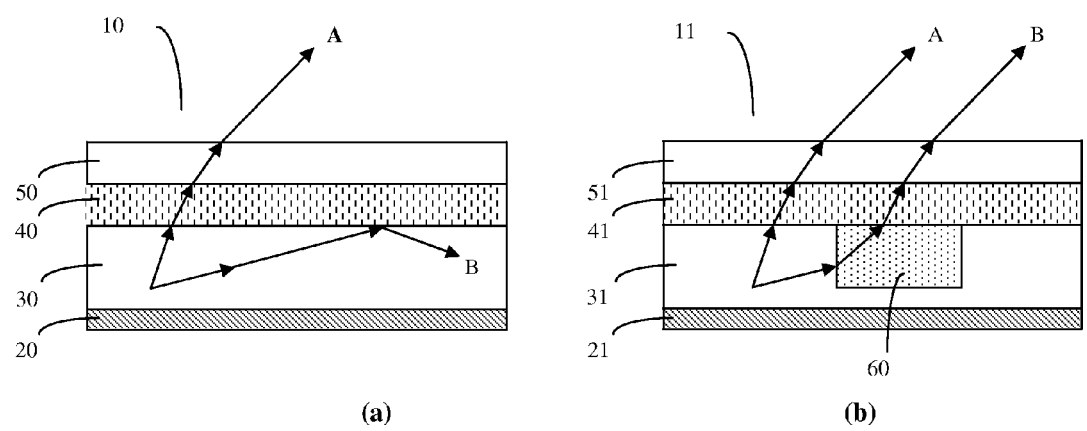
FIG. 2a provides a schematic image showing the path of photons emitted from an electroluminescent layer in a device without internal lenses.
FIG. 2b provides a schematic image showing the path of photons emitted from an electroluminescent layer in a device with internal lenses.

FIG. 2 shows an application of the phenomenon shown in FIG. 1b. In FIG. 2(a), device 10 is a simplified representation of an OLED, and comprises electrode 20, electroluminescent layer 30, electrode 40, and substrate 50. It will be appreciated that either electrode 20 or electrode 40 can be a hole injection electrode, and the other will be an electron injection electrode. Light rays A and B are emitted from a position within electroluminescent layer 30. Light ray A is emitted at an angle such that it passes through the interfaces between the various layers and escapes device 10. Light ray B, however, is emitted at a different angle. Upon encountering the interface between electroluminescent material 30 and electrode 40, the angle of incidence is such that light ray B is internally reflected rather than passing through the interface. Light ray B is therefore not able to escape device 10. In FIG. 2(b), device 11 is also a simplified representation of an OLED, and comprises electrode 21, electroluminescent layer 31, electrode 41, and substrate 51. Light rays A and B are again emitted from a position within electroluminescent layer 31. Light ray A is again emitted at a steeper angle, and is able to escape device 11 by passing through the interfaces between the various layers. Light ray B is again emitted at a different angle, but prior to encountering any interfaces, encounters lens 60. Lens 60 has an index of refraction lower than the indices of refraction of electroluminescent material 31 and electrode 41. Accordingly, light ray B is guided such that it is able to escape device 11.

FIGS. 3(a)-(i) show non-limiting examples (1110-1118) of device geometries comprising lens elements. In the figures, substrate 1120 comprises a transparent material, as described herein, such as glass. Hole injection layer 1130 comprises a transparent material, as described herein, such as ITO. Lens elements 1140 are transparent materials having a relatively low index of refraction (i.e., low relative to the adjacent materials), as described herein, such as $SiO_2$, and may also function as dielectric layers where appropriate. Electroluminescent layer 1150 is an organic electroluminescent material, as described herein, such as an electroluminescent polymer. Electron injection layer 1160 is generally, although not necessarily, a metal (such as aluminum). Accordingly, in devices 1110-1118, light is generated in electroluminescent layer 1150 and exits the devices through substrate 1120 (i.e., downward, given the orientation of the devices in the figures).

Figure 3:
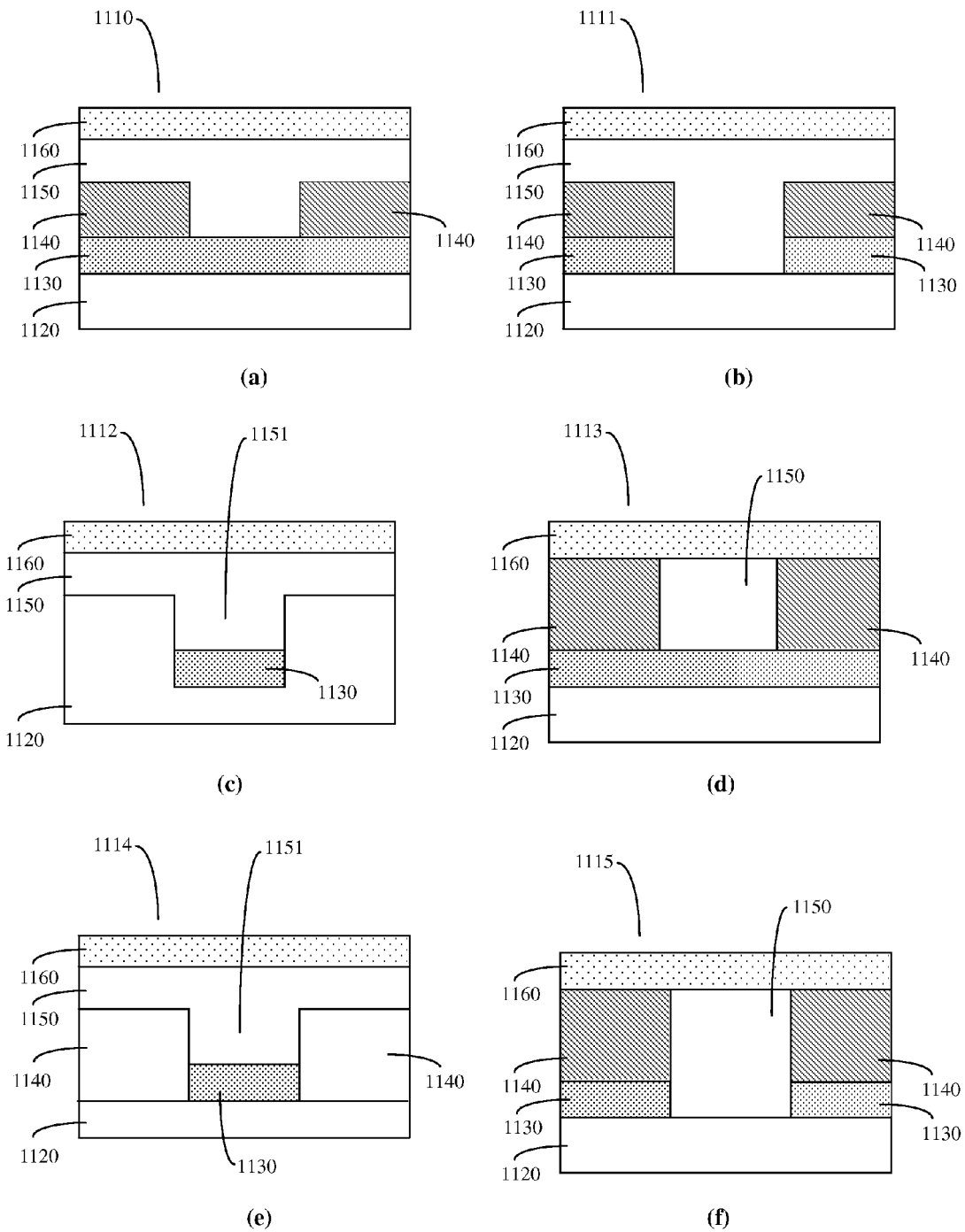
FIGS. 3a-3i provide schematic images showing various device architectures as described in more detail herein.
Figure 3:
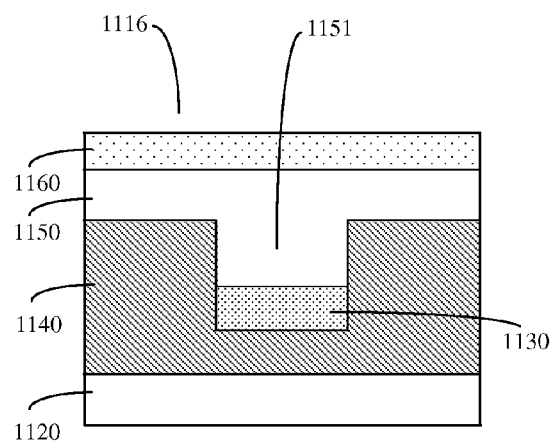
Figure 3:
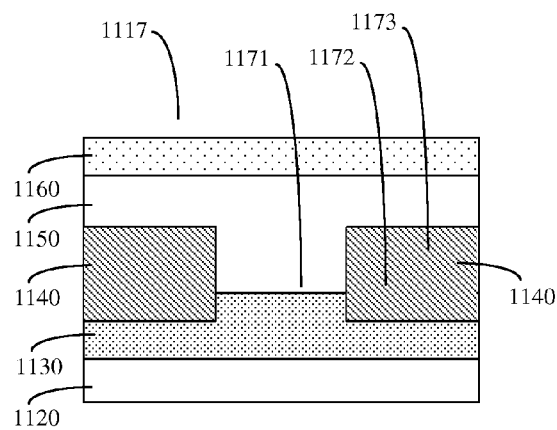
Figure 3:
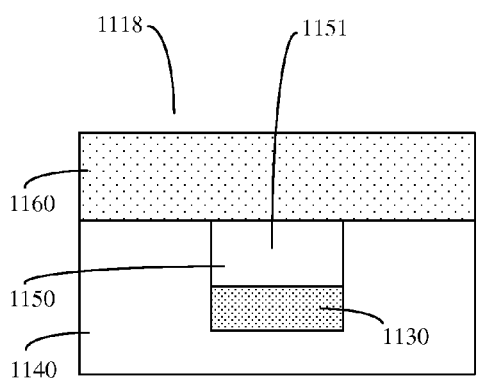

In devices 1110 and 1111 (FIGS. 3(a) and 3(b)), lens elements 1140 also functions as the dielectric layers of the devices. In device 1110, hole-injection electrode 1130 is necessarily constructed using a transparent material (e.g., ITO) so that light may pass and exit the device. In device 1111, since the electroluminescent layer 1150 traverses the hole-injection electrode 1130, the latter may be constructed from either a transparent or an opaque material.

In device 1112 (FIG. 3(c)), although hole injection layer 1130 appears as an isolated region of material, it will be appreciated that this is merely a result of the cross-sectional view shown. In fact, hole injection layer 1130 is a single, continuous layer throughout the device. By "continuous" is meant that there are no regions of the layer that are electrically isolated from other regions of the layer. An electrically conductive path exists between any two locations in the layer, and such path exists entirely within the layer (i.e., does not require traversal into an adjacent layer).

In device 1112 (FIG. 3(c)), a separate dielectric layer is not present. Instead, the lens effect is obtained due to patterning of substrate 1120 into a series of interconnected channels. Thus, hole injection layer 1130 is disposed within cavity 1151 in substrate 1120, although hole injection material only partially fills cavity 1151. Electroluminescent material from electroluminescent layer 1150 fills the remaining space in cavity 1151. As a result of this geometry, substrate 1120 functions also as lens elements, and is therefore prepared from any of the materials suitable for the lens layer as described herein.

In some embodiments, device 1112 is made by etching cavity 1151 as a series of interconnected channels from substrate 1120. In such embodiments, device 1112 does not contain a plurality of cavities as holes, but rather contains one or more interconnected cavity or cavities (i.e., channel). It will be appreciated that, even when all of the cavities form a single, completely interconnected channel, such arrangement is still referred to herein as containing a plurality of cavities. In a top-down view of such a device (not shown), substrate 120 appears as isolated islands or as an interdigitated and continuous series of channels.

In some embodiments of device 1112, cavities 1151 are not interconnected. Hole injection layer 1130 remains an interconnected and continuous grid. Above hole injection layer 1130 exists a plurality of isolated cavities (i.e., holes rather than the channels described above) 1151 that are each filled with electroluminescent material from electroluminescent layer 1150. In a top-down view of such a device (not shown), substrate 120 appears as a continuous layer with cavities 1151 disposed therein.

Device 1116 in FIG. 3(g) is similar in geometry to device 1112, except that device 1116 includes a separate substrate layer 1120 upon which lens layer 1140 is disposed. Furthermore, device 1118 in FIG. 3(i) is similar in geometry to device 1112, except that in device 1118, electroluminescent layer 1150 is entirely contained within cavity 1151 and does not overflow the cavity. Thus, electroluminescent layer 1150 is not present over the entire device area, but only within the cavities of device 1118.

In FIG. 3(e), device 1114 contains lens elements 1140, which contact substrate 1120 and form the sides of cavity 1151. It will be appreciate that, if the material used to form lens elements 1140 is the same as the material used to form substrate 1120, then device 1114 will have the same geometry as device 1112 (with the exception that an interface exists between the lens elements and the substrate in device 1114, whereas no such interface exists in device 1112).

In FIGS. 3(c), 3(e), 3(f), and 3(g) (i.e., devices 1112, and 1114-1116), the material forming hole injection layer 1130 need not be a transparent material, since light may reach substrate 1120 (and subsequently escape the device) through gaps in hole injection layer 1130. In device 1113, hole-injection electrode 1130 is necessarily constructed using a transparent material (e.g., ITO) so that light may pass and exit the device. In device 1116 (FIG. 3g), lens element 140 comprises an optical material different from that of substrate 1120.

In device 1117, shown in FIG. 3(h), electroluminescent layer 1150 and hole injection layer 1130 have complimentary patterns such that they make contact in a plurality of regions (only one shown, 1171) and do not make contact in a plurality of regions (only one labeled, 1172). In the regions where electroluminescent layer 1150 and hole injection layer 1130 do not make contact, cavities are created (only one labeled, 1173), and optical layer 1140 is disposed within such cavities.

Materials

As summarized above, an aspect of the subject invention is an electroluminescent device. In certain embodiments, the electroluminescent device includes a substrate. Any suitable substrate may be used so long as it is of sufficient mechanical strength to be used as a base upon which the layered structure of the invention can be provided.

Accordingly, the substrate may be comprised of any of a number of materials depending on the desired use for which the electroluminescent device is to be employed. For example, in certain embodiments, radiation generated by the combining of holes and electrons in the electroluminescent material results in the generation of electromagnetic radiation (e.g., light) that is to be emitted and transmitted through the substrate. Hence, in certain embodiments, the substrate may be transparent or semi-transparent to the emitted radiation.

Various silicon, ceramic and polymeric materials have sufficient optical transparency for transmitting visible emitted radiation. Hence, a suitable substrate for use with the subject invention may be a transparent or semi-transparent base material that includes silicon, a ceramic, plastic(s) and/or a polymeric material.

Suitable substrate materials may be crystalline or amorphous. Suitable silicon derived materials include, but are not limited to silicon dioxide, various silicon-based glasses, such as soda-lime glass and borosilicate glass. Suitable transparent or semi-transparent ceramics include, but are not limited to, aluminum oxide, zirconium oxide, sodium chloride, diamond, and/or the like. Examples of transparent or semi-transparent polymeric materials for transmitting emitted radiation include, but are not limited to, polyethylenenaphthalate, polycarbonate, polyethylene, polypropylene, polyester, polyimide, polyamides, polyacrylates and polymethacryates.

The substrate may be rigid or flexible and may be of any suitable shape and configuration. Accordingly, in certain embodiments, a flexible polymeric substrate is provided. Optionally, an insulating layer may be included between the substrate and/or one or more of the other layers of the subject device. Further, the substrate may be detachable from the layered structure of the device. Additionally, in certain embodiments, the substrate may include a semiconductor material, such as silicon, and may additionally contain microcircuitry, in which case, the electroluminescent device may comprise an integrated portion of a microcircuitry-driven device.

In other embodiments, the devices of the invention comprise a non-transparent substrate. In such devices, emission of photons by the device is not through the substrate, but is rather through the top portion of the device (e.g., the top electrode or any layers covering the top electrode). Any suitable non-transparent (and non-conducting) material may be used for such substrates. Examples include plastics, certain metal oxides, coated metals, colored glasses, biological materials such as wood, and the like.

The dielectric layer is optional in the devices of the invention, and may be composed of any suitable material capable of serving as a barrier between the electrodes to provide an electrical barrier and to prevent electrical shorting between the electrode layers. Accordingly, in certain embodiments, the dielectric layer is substantially pinhole free and composed from a high-resistivity material having an electrical resistivity no less than about $10^8$ ohm-cm, preferably no less than about $10^{12}$ ohm-cm. Suitable high-resistivity materials include, but are not limited to, silicon nitride, boron nitride, aluminum nitride, silicon oxide, titanium oxide, aluminum oxide, polyimide, polyvinylidene fluoride, paralene, as well as various sol-gel materials and pre-ceramic polymers.

The hole-injection electrode layer may be composed of any suitable material capable of injecting holes into an associated material, for instance, an electroluminescent material. For example, various metallic, polymeric, ceramic and semiconducting materials may be capable of injecting holes into an associated electroluminescent material that is in contact with the hole-injection electrode layer. In certain embodiments, the hole-injection electrode layer includes a metallic material, for instance, a material with a high electrical conductivity. In certain embodiments, the hole-injection electrode layer includes a high work function material. Accordingly, in certain embodiments, the hole-injection electrode layer includes a metal such as gold or copper or other such metallic material with a high conductivity and chemical inertness with respect to the other components of the electroluminescent device. Other metals and/or other materials suitable for use as a hole-injection electrode material include, but are not limited to, nickel, palladium, platinum, chromium, molybdenum, tungsten, manganese, nickel, cobalt, metal oxides and combinations and alloys thereof, as well as fullerenes, carbon nano-tubes. For instance, where the bottom electrode layer may be an anode layer, the anode may be prepared from indium tin oxide (ITO).

In certain embodiments, the hole-injection electrode layer may include a conductive polymeric material, a small molecular organic, and/or inorganic layer. For instance, the hole-injection electrode layer may include an anode layer as well as a hole transport layer. Accordingly, the hole-injection electrode layer may include a polymeric material such as, but not limited to: polyaniline, polypyrrole and poly(3,4-ethylenedioxy-2,5-thiophene), triphenylamine, tetra-N-phenylbenzidine, N,N'-Di-[(1-naphthyl)-N,N'-diphenyl]-1,1'-biphenyl)-4,4'-diamine, and their derivatives and analogs. In addition, certain ceramic materials such as conductive chalcogenides, e.g., metal oxides, mixed metal oxides and metal sulfides as well as mixed metal sulfides may also be suitable.

In certain embodiments, the electrode layer is constructed as a laminate, composite or mixture of materials. Additionally, the electrode layer may have a thickness of about 200 to about 10,000 angstroms, for instance, about 400 to about 5000 angstroms, such as about 1000 to about 2000 angstroms.

The electron-injection electrode layer may be composed of any suitable material capable of injecting electrons into an associated electroluminescent material. For example, various metallic, polymeric, ceramic and semiconducting materials may be capable of injecting electrons into the electroluminescent material, such as metals like lithium, barium, beryllium, magnesium, calcium, sodium, potassium, cesium, strontium, boron, aluminum, gallium, indium, silver and alloys thereof. In certain embodiments, the electron-injection electrode layer includes an alloy containing a low work function material (e.g., Li—Al or Mg—Al) and/or may include a bilayer structure, i.e. an electron-injection layer may include a low work function metal or a compound containing such low work function metal elements (e.g., lithium fluorite, lithium oxide, barium oxide, barium acetylacetonate), which may be capped by a conduction layer (e.g., Ca/Al, Ba/Al, or Mg/Ag). In certain embodiments, the electron-injection layer includes a cathode layer as well as an electron-injection and/or transport layer.

Accordingly, the electron-injection layer can be the cathode metal itself (for instance, in the case of using and Li—Al or Mg—Ag alloy cathode) or an electrode layer (such as Al or Ag) plus a electron-injection layer (such as a thin layer of Ca, Li, Mg, LiF, or even an organic compound). In certain embodiments, the term "cathode" refers to the electrode metal plus the electron-injection layer; and in certain embodiments, the term "cathode" refers only to the electron-injection layer. For example, a "Ca/Al cathode" may generally be referred to as a "Ca cathode".

In certain embodiments, the electron-injection electrode layer is constructed as a laminate, composite or mixture of materials. Additionally, the electron-injection electrode layer may have a thickness of about 200 to about 10,000 angstroms, for instance, about 400 to about 5000 angstroms, such as about 1000 to about 2000 angstroms. In certain embodiments, the electron-injection electrode layer is a composite of two layers, such as a thin layer of about 10 to about 200 angstroms of a low work function metal that may be in contact with an electroluminescent material and/or a dielectric layer, and a thicker top layer of a metal such as silver or aluminum. In certain embodiments, the electron-injection electrode layer is configured for directing light through the substrate.

The electroluminescent devices of the invention include an electroluminescent layer comprising an electroluminescent material. The electroluminescent material may be composed of any suitable material capable of receiving a hole from the hole-injection layer and an electron from the electron-injection layer and emitting electromagnetic radiation (e.g., light) when the injected holes and electrons combine. Accordingly, in certain embodiments, the electroluminescent material may include any of a number of organic or inorganic compounds or mixtures thereof, such as multi-layers of organics or small molecules or the like. For instance, the electroluminescent layer may include a polymeric material or be composed of one or more small molecule materials. However, the material must contain at least one electroluminescent compound, for instance, an organic, inorganic or small molecule electroluminescent compound. In certain embodiments, the electroluminescent compound may include a simple organic molecule or complex polymer or copolymer. For example, a simple organic luminescent molecule may include tris(8-hydroxyquinolinato)-aluminum or perylene.

In certain embodiments, the electroluminescent material includes a polymer or copolymer. The molecular structure of a suitable polymer or copolymer may include a carbon-based or silicon-based backbone. The polymers and copolymers may be linear, branched, crosslinked or any combinations thereof, and may have a wide range of molecular weights from as low as about 5000 to more than 1,000,000. In the case of copolymers, the copolymers may be alternating, block, random, graft copolymers, or combinations thereof. Examples of suitable electroluminescent polymers useful in conjunction with the present invention include, but are not limited to, conjugated polymers such as, polyparaphenylenes, polythiophenes, polyphenylenevinylenes, polythienylvinylenes, polyfluorenes, 1,3,4-oxadiazole-containing polymers, and various derivatives and copolymers thereof.

An exemplary electroluminescent polymer is an arylamine-substituted poly(arylene-vinylene) polymer that has the general structure of formula (I) below:

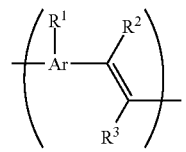

wherein: Ar is arylene, heteroarylene, substituted arylene or substituted heteroarylene containing one to three aromatic rings;

$R^1$ is the arylamine substituent and is of the formula —$Ar^1$—$N(R^4R^5)$ wherein $Ar^1$ is as defined for Ar and $R^4$ and $R^5$ are independently hydrocarbyl, substituted hydrocarbyl, heteroatom-containing hydrocarbyl, or substituted heteroatom-containing hydrocarbyl; and $R^2$ and $R^3$ are independently selected from the group consisting of hydrido, halo, cyano, hydrocarbyl, substituted hydrocarbyl, heteroatom-containing hydrocarbyl, and substituted heteroatom-containing hydrocarbyl, or $R^2$ and $R^3$ may together form a triple bond.

Other moieties may be as follows:

Ar may be a five-membered or six-membered arylene, heteroarylene, substituted arylene or substituted heteroarylene group, or may contain one to three such groups, either fused or linked. Preferably, Ar is comprised of one or two aromatic rings, and is most preferably comprised of a single aromatic ring that is five-membered or six-membered arylene, heteroarylene, substituted arylene or substituted heteroarylene. $Ar^1$, the arylene linking moiety in the arylamine substituent, is defined in the same way.

The substituents $R^2$ and $R^3$ are generally hydrido but may also be halo (particularly chloro or fluoro) or cyano, or substituted or unsubstituted alkyl, alkoxy, alkenyl, alkynyl, aryl and heteroaryl.

$R^4$ and $R^5$ may the same or different and, as noted, are hydrocarbyl, substituted hydrocarbyl, heteroatom-containing hydrocarbyl, or substituted heteroatom-containing hydrocarbyl. For example, $R^4$ and $R^5$ may be alkyl, alkoxy-substituted alkyl, polyether-substituted alkyl, nitro-substituted alkyl, halo-substituted alkyl, aryl, alkoxy-substituted aryl, polyether-substituted aryl, nitro-substituted aryl, halo-substituted aryl, heteroaryl, alkoxy-substituted heteroaryl, polyether-substituted heteroaryl, nitro-substituted heteroaryl, halo-substituted heteroaryl, and the like. In certain embodiments the substituents are aryl, e.g., phenyl, alkoxy-substituted phenyl (particularly lower alkoxy-substituted phenyl such as methoxyphenyl), polyether-substituted phenyl (particularly phenyl substituted with a —$CH_2(OCH_2\ CH_2)_nOCH_3$ or —$(OCH_2\ CH_2)_2\ OCH_3$ group where n is generally 1 to 12, preferably 1 to 6, most preferably 1 to 3), and halo-substituted phenyl (particularly fluorinated or chlorinated phenyl).

Another exemplary electroluminescent polymer material that is described in U.S. Pat. No. 6,414,104, is an arylamine-substituted poly(arylene-vinylene) polymer that contains monomer units having the general structure of formula (II) as follows:

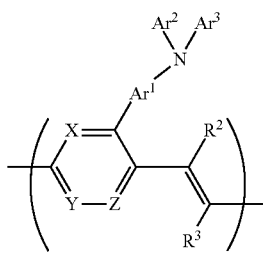

Wherein: X, Y and Z are independently selected from the group consisting of N, CH and $CR^6$ wherein $R^6$ is halo, cyano, alkyl, substituted alkyl, heteroatom-containing alkyl, aryl, heteroaryl, substituted aryl, or substituted heteroaryl, or wherein two $R^6$ moieties on adjacent carbon atoms may be linked to form an additional cyclic group;

$Ar^1$ is as defined above;

$Ar^2$ and $Ar^3$ are independently selected from the group consisting of aryl, heteroaryl, substituted aryl and substituted heteroaryl containing one or two aromatic rings; and $R^2$ and $R^3$ are as defined above.

In formula (I) above, the polymer is a poly(phenylene vinylene) derivative when X, Y and Z are all CH. When at least one of X, Y and Z is N, the aromatic ring will be, for example, substituted or unsubstituted pyridinyl, pyridazinyl, pyrimidinyl, pyrazinyl, 1,2,4-triazinyl, or 1,2,3-triazinyl. For instance, one of X, Y and Z may be CH and the other two may be either CH or $CR^6$, wherein $R^6$ may be a heteroatom-containing alkyl, for instance, alkoxy, or a polyether substituent —$CH_2(OCH_2CH_2)_nOCH_3$ or —$(OCH_2CH_2)_nOCH_3$ group where n is may be 1 to 12, for instance, 1 to 6, such as 1 to 3.

The polymer may be a homopolymer or a copolymer with at least one additional type of monomer unit. Preferably, if the polymer is a copolymer, the additional monomer units are also arylene-vinylene monomer units, for example having the structure of Formula (III):

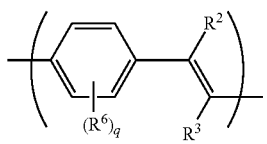

wherein $R^2$, $R^3$ and $R^6$ are as defined previously and q is an integer in the range of zero to 4 inclusive.

Examples of specific polymers having the structure of formula (I) are poly(2-(4-diphenylamino-phenyl)-1,4-phenylene vinylene and poly(2-(3-diphenylaminophenyl)-1,4-phenylene vinylene.

Examples of specific polymers disclosed in U.S. Pat. No. 6,414,104 are poly(2-(4-diphenylamino-phenyl)-1,4-phenylene vinylene and poly(2-(3-diphenylaminophenyl)-1,4-phenylene vinylene.

Electroluminescent polymers appropriate for use in this invention are also described in U.S. Pat. Nos. 6,723,828, 6,800,722, and 7,098,297, all of which are incorporated by reference herein. In those referenced patents there is disclosed a conjugated polymer containing monomer units having the structure of formula (IV):

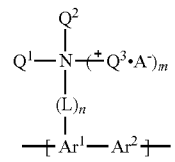

Wherein: $Ar^1$ and $Ar^e$ are independently selected from the group consisting of monocyclic, bicyclic and polycyclic arylene, heteroarylene, substituted arylene and substituted heteroarylene groups;

L is alkylene, alkenylene, substituted alkylene, substituted alkenylene, heteroalkylene, heteroalkenylene, substituted heteroalkylene, substituted heteroalkenylene, arylene, heteroarylene, substituted arylene or substituted heteroarylene;

m is zero or 1;

n is zero or 1;

$Q^1$ and $Q^2$ are independently selected from the group consisting of H, aryl, heteroaryl, substituted aryl, substituted heteroaryl, alkyl, and substituted alkyl, and $Q^3$ is selected from the group consisting of alkyl and substituted alkyl, with the proviso that when m is 1, $Q^1$ and $Q^2$ are other than H; and $A^-$ is a negatively charged counterion.

The electroluminescent material may also include blends of polymers within formula (IV) with other polymers, as well as a variety of copolymers.

Methods of Fabricating an Electroluminescent Device

Figure 4:
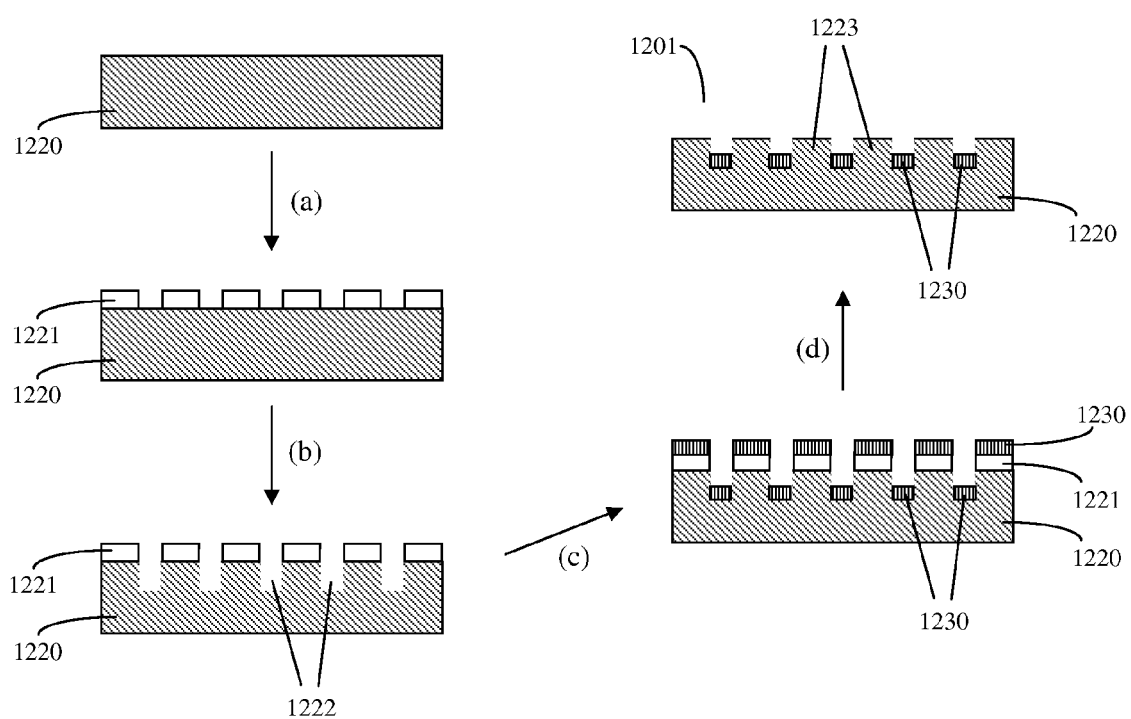
FIG. 4 provides a schematic representation of a method for preparing an electroluminescent device having embedded microlenses according to the disclosure.
Figure 5:
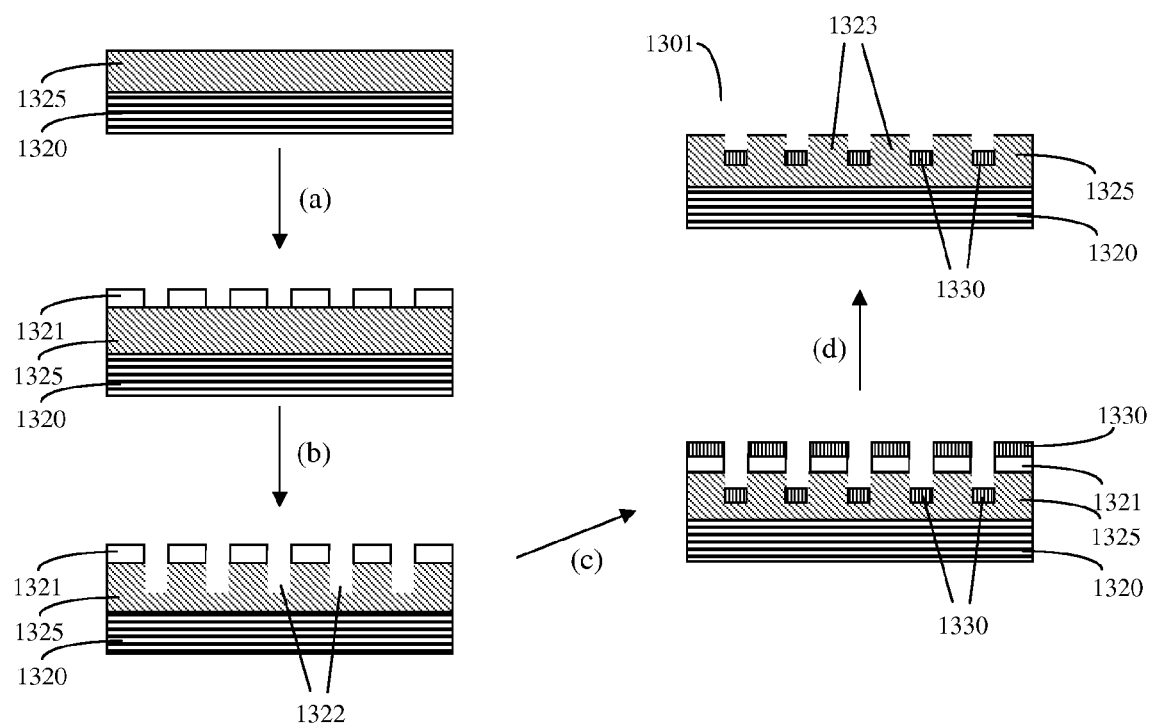
FIG. 5 provides a schematic representation of a method for preparing an electroluminescent device having embedded microlenses according to the disclosure.
Figure 6:
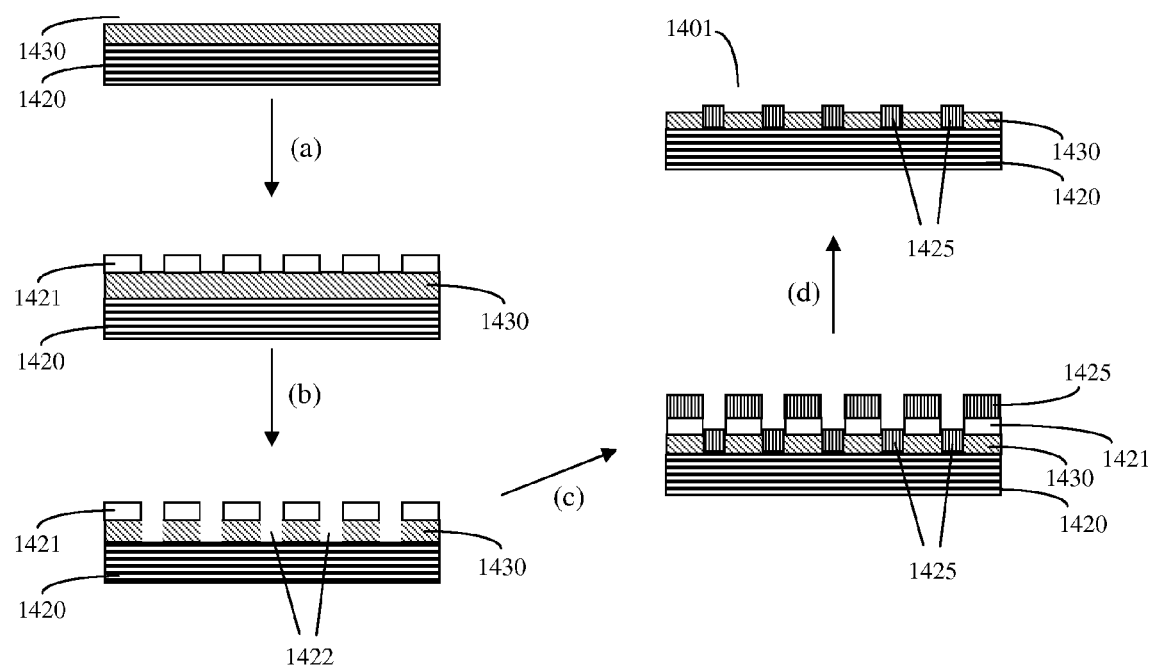
FIG. 6 provides a schematic representation of a method for preparing an electroluminescent device having embedded microlenses according to the disclosure.

With reference to FIGS. 4-6, three processes for generating internal lenses are described below. It will be appreciated that these processes are merely illustrative, and are not meant to be limiting in any way.

Process 1, as exemplified in FIG. 4. The fabrication process starts with substrate 1220. The desired electrode pattern is imaged onto the substrate using standard lithography such as standard photolithography, stepper lithography, laser interference lithography, imprint lithography, etc. Thus, as shown in step (a) of FIG. 4, patterned resist layer 1221 is deposited over substrate 1220. In step (b), substrate 1220 is etched, either by wet-etch or dry-etch, to the desired depth, thereby forming cavities 1222 in the desired pattern. In step (c), an electrode material (such as, for example, ITO) is deposited to form electrode layer 1230, which is present in two regions—overlaying resist layer 1221 and in cavities 1222 etched into substrate 1220. In step (d), using a lift-off process, the overlaying electrode layer 1230 and resist layer 1221 are removed from the device. The result of this process is object 1201, which comprises substrate 1220, electrode layer 1230, and lens elements 1223 as protrusions of the substrate material through electrode layer 1230.

Process 2, as exemplified in FIG. 5. The fabrication process starts with substrate 1320. Optical layer 1325 overlays substrate 1320, and may be made from any suitable optical material as described herein. The desired electrode pattern is imaged onto optical layer 1325 using standard lithography such as standard photolithography, stepper lithography, laser interference lithography, imprint lithography, etc. Thus, as shown in step (a) of FIG. 5, patterned resist layer 1321 is deposited over optical layer 1325. In step (b), optical layer 1325 is etched, either by wet-etch or dry-etch, to the desired depth, thereby forming cavities 1322 in the desired pattern. In step (c), an electrode material (such as, for example, ITO) is deposited to form electrode layer 1330, which is present in two regions—overlaying resist layer 1321 and in cavities 1322 etched into optical layer 1325. In step (d), using a lift-off process, the overlaying electrode layer 1330 and resist layer 1321 are removed from the device. The result of this process is object 1301, which comprises substrate 1320, optical layer 1325, electrode layer 1330, and lens elements 1323 as protrusions of the optical material through electrode layer 1330.

Process 3, as exemplified in FIG. 6. The fabrication process starts with substrate 1420. Electrode layer 1430 overlays substrate 1420, and may be made from any suitable optically transparent electrode material as described herein. The desired lens element pattern is imaged onto electrode layer 1430 using standard lithography such as standard photolithography, stepper lithography, laser interference lithography, imprint lithography, etc. Thus, as shown in step (a) of FIG. 6, patterned resist layer 1421 is deposited over electrode layer 1430. In step (b), electrode layer 1430 is etched, either by wet-etch or dry-etch, thereby forming cavities 1422 in the desired pattern. In step (c), an optical material (such as, for example, $SiO_2$) is deposited to form optical layer 1425, which is present in two regions—overlaying resist layer 1421 and in cavities 1422 etched into electrode layer 1430. In step (d), using a lift-off process, the overlaying optical layer 1425 and resist layer 1421 are removed from the device. The result of this process is object 1401, which comprises substrate 1420, electrode layer 1430, and lens elements 1425.

While the invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the invention. All such modifications are intended to be within the scope of the claims appended hereto.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application. Citation herein by the Applicant of a publication, patent, or published patent application is not an admission by the Applicant of said publication, patent, or published patent application as prior art.

What is claimed is:

1. An electroluminescent device comprising:
an electroluminescent layer comprising an organic electroluminescent material;
an electron injection layer contacting the electroluminescent layer and comprising an electron injection material;
a hole injection layer contacting the electroluminescent layer and comprising a hole injection material; and
a lens layer contacting the electroluminescent layer and comprising an optical material having a refractive index lower than the refractive index of the electroluminescent material, wherein:
the lens layer is continuous and is patterned with an interconnected network of cavities, wherein the cavities extend partially through the thickness of the lens layer;
one of the electron injection layer or the hole injection layer is entirely disposed within the cavities; and
at least a portion of the electroluminescent material is disposed within the cavities,
wherein the lens layer is disposed on a transparent substrate, and wherein the cavities do not extend entirely through the lens layer to the substrate.

2. An electroluminescent device comprising:
an electroluminescent layer comprising an organic electroluminescent material;
an electron injection layer contacting the electroluminescent layer and comprising an electron injection material;
a hole injection layer contacting the electroluminescent layer and comprising a hole injection material; and
a lens layer contacting the electroluminescent layer and comprising an optical material having a refractive index lower than the refractive index of the electroluminescent material, wherein:
the lens layer is continuous and is patterned with an interconnected network of cavities, wherein the cavities extend partially through the thickness of the lens layer;
one of the electron injection layer or the hole injection layer is entirely disposed within the cavities; and
at least a portion of the electroluminescent material is disposed within the cavities,
wherein the lens layer is disposed on a transparent substrate, and wherein the cavities do not extend entirely through the lens layer to the substrate, and wherein the electroluminescent layer overfills the cavities and forms a layer that is present over the entire device area.

3. An electroluminescent device comprising:
an electroluminescent layer comprising an organic electroluminescent material;
an electron injection layer contacting the electroluminescent layer and comprising an electron injection material;
a hole injection layer contacting the electroluminescent layer and comprising a hole injection material; and
a lens layer contacting the electroluminescent layer and comprising an optical material having a refractive index lower than the refractive index of the electroluminescent material, wherein:
the lens layer is continuous and is patterned with an interconnected network of cavities, wherein the cavities extend partially through the thickness of the lens layer;
one of the electron injection layer or the hole injection layer is entirely disposed within the cavities; and
at least a portion of the electroluminescent material is disposed within the cavities,
wherein the cavities extend between 25% and 75% through the thickness of the lens layer, and wherein the electroluminescent layer overfills the cavities and forms a layer that is present over the entire device area.

* * * * *